US010574258B1

(12) United States Patent
Albel et al.

(10) Patent No.: US 10,574,258 B1
(45) Date of Patent: Feb. 25, 2020

(54) OPEN PIN DETECTION FOR ANALOG-TO-DIGITAL CONVERTER

(71) Applicant: Infineon Technologies AG, Neubiberg (DE)

(72) Inventors: Siegfried Albel, Arriach (AT); Matthias Bogus, Munich (DE); Christian Heiling, Graz (AT); Jaafar Mejri, Ottobrunn (DE); Markus Zannoth, Neubiberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/387,050

(22) Filed: Apr. 17, 2019

(51) Int. Cl.
*H03M 3/00* (2006.01)
*H03M 7/30* (2006.01)

(52) U.S. Cl.
CPC ............. *H03M 3/48* (2013.01); *H03M 3/462* (2013.01); *H03M 3/39* (2013.01); *H03M 7/30* (2013.01)

(58) Field of Classification Search
CPC .......... H03M 3/48; H03M 3/462; H03M 7/30; H03M 3/39
USPC .................................................. 341/143, 155
See application file for complete search history.

(56) References Cited

U.S. PATENT DOCUMENTS

| | | | |
|---|---|---|---|
| 6,298,361 B1 | 10/2001 | Suzuki | |
| 7,526,254 B2 | 4/2009 | Toporski | |
| 8,358,229 B2 | 1/2013 | Barrenscheen | |
| 9,866,778 B2 * | 1/2018 | Shem | H03M 3/462 |
| 9,979,411 B1 * | 5/2018 | Gupta | H03M 3/376 |
| 10,135,459 B2 * | 11/2018 | Sharma | A61B 5/04284 |
| 10,243,578 B2 * | 3/2019 | Dagher | H03M 1/1245 |
| 2002/0046227 A1 | 4/2002 | Goszewski et al. | |

OTHER PUBLICATIONS

Allegro, "Automotive, Three Phase MOSFET Driver," Allegro Microsystems, LLC Confidential Information, A4911, Jun. 1, 2016, 61 pages.
Mike Hartshorne, "Using the AMC1210 in Resolver Motor Control Systems," Texas Instruments Application Repoli SBAA144 May 2006, 13 pages.
Robert Kiely "Understanding and Eliminating 1/f Noise," Analog Devices, Analog Dialogue 51-05, May 2017, 4 pages.
Dara O'Sullivan "Isolated Motor Control Feedback Using the ADSP-CM402F/ADSP-CM403F-ADSP-CM407F/ADSP-CM408F Sinc Filters and the AD7403," Analog Devices, AN-1265 Application Note, Rev. B, Norwood, MA, 20 pages.

* cited by examiner

*Primary Examiner* — Brian K Young
(74) *Attorney, Agent, or Firm* — Slater Matsil, LLP

(57) ABSTRACT

A method includes applying a current to an input pin of an integrated circuit; converting an analog signal at the input pin to a digital stream using a Sigma-Delta modulator; converting the digital stream to a first digital output signal proportional to the analog signal in a first input range between a first analog signal value and a second analog signal value, where the first input range corresponds to a pre-determined range of the analog signal smaller than a full-scale input range of the analog signal; converting the digital stream to a second output signal; comparing the second output signal to a first threshold corresponding to a third analog signal value at the input pin that is outside of the first input range; and providing an indication of an open circuit condition at the input pin when the second output signal crosses the first threshold.

21 Claims, 10 Drawing Sheets

US 10,574,258 B1

OPEN PIN DETECTION FOR ANALOG-TO-DIGITAL CONVERTER

TECHNICAL FIELD

Embodiments of the invention relate generally to analog-to-digital converter (ADC) circuits, and more particularly to systems and methods for detecting open pin conditions in analog-to-digital converter circuits.

BACKGROUND

AC motors such as three-phase motors are gaining popularity in applications such as automotive, industrial, and HVAC (heat, ventilating and air conditioning). By replacing the mechanical commutator used in traditional motors with electronic devices, improved reliability, improved durability and small form factors are achieved. Additional advantages of AC motors include better speed versus torque characteristics, faster dynamic response, and higher speed ranges, as examples. Generally, an AC motor (e.g., a three-phase motor) has a controller that generates a pulse-width modulated (PWM) signal used to produce drive signals for power switches coupled to different phases of the motor. These PWM signals may determine the average voltage and average current supplied to the coils of the motor, thus controlling the motor speed and torque.

For closed-loop control of the AC motor, the status of the motor may be provided to a controller of the motor system, e.g., via a feedback path. For example, phase currents of the three-phase motor are measured and the measured values are sent to the controller, which generates the PWM control signals based on the measured values of the phase currents. Analog-to-digital converters (ADCs) are often used to convert analog signals (e.g., the phase current in each phase of the three-phase motor) into digital data in motor control applications.

SUMMARY OF THE INVENTION

In accordance with an embodiment, a method includes applying a current to an input pin of an integrated circuit; converting an analog signal at the input pin to a digital stream using a Sigma-Delta modulator; converting the digital stream to a first digital output signal using a decimation filter, where the first digital output signal is proportional to the analog signal at the input pin in a first input range between a first analog signal value and a second analog signal value, where the first input range corresponds to a pre-determined range of the analog signal that is smaller than a full-scale input range of the analog signal; converting the digital stream to a second output signal; comparing the second output signal to a first threshold, where the first threshold corresponds to a third analog signal value of the analog signal at the input pin that is outside of the first input range; and providing an indication of an open circuit condition at the input pin when the second output signal crosses the first threshold.

In accordance with an embodiment, an integrated circuit includes a pin biasing circuit configured to provide a current to an input pin of the integrated circuit; a Sigma-Delta modulator having an input coupled to the input pin; a decimation filter coupled to an output of the Sigma-Delta modulator and configured to provide a first digital output signal that is proportional to an analog signal at the input pin in a first input range between a first analog signal value and a second analog signal value, where the first input range corresponds to a pre-determined range of the analog signal that is smaller than a full-scale input range of the analog signal; and an open pin detection circuit coupled to the output of the Sigma-Delta modulator, the open pin detection circuit configured to convert the output of the Sigma-Delta modulator to a second output signal, compare the second output signal to a first threshold, where the first threshold corresponds to a third analog signal value of the analog signal at the input pin that is outside of the first input range, and provide an indication of an open circuit condition at the input pin when the second output signal crosses the first threshold.

In accordance with an embodiment, an analog-to-digital converter circuit includes a first input terminal and a second input terminal; a Sigma-Delta modulator coupled to the first input terminal and the second input terminal and configured to convert a voltage between the first input terminal and the second input terminal into a one-bit data stream; a pull-up circuit configured to be coupled between a voltage supply node and the first and the second input terminals and to pull a first voltage at the first input terminal to a first voltage value higher than a pre-determined voltage threshold when the first input terminal is left open, or to pull a second voltage at the second input terminal to the first voltage value when the second input terminal is left open, where the pre-determined voltage threshold is smaller than a full-scale input voltage of the Sigma-Delta modulator by a pre-determined percentage; a first low-pass filter coupled to an output of the Sigma-Delta modulator and configured to convert the one-bit data stream into a first multi-bit data stream at an output of the analog-to-digital converter circuit; and an open pin detection circuit coupled to the output of the Sigma-Delta modulator and configured to detect that the voltage between the first input terminal and the second input terminal is above the pre-determined voltage threshold using the one-bit data stream.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, unless otherwise specified, the same or similar reference numerals in different figures generally refer to the same component part, which will generally not be re-described in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely detection of an open pin condition of an analog-to-digital converter (ADC) circuit. In some embodiments, an ADC circuit includes a Sigma-Delta ADC circuit and an open pin detection circuit. The input port of the ADC circuit is connected to a pull-up circuit, in addition to being connected to an analog input signal. The Sigma-Delta modulator of the Sigma-Delta ADC circuit converts the input analog signal into a one-bit data stream, which is then converted into multi-bit data by the decimation filter of the Sigma-Delta ADC circuit. The open pin detection circuit forms an estimate of the value (e.g., voltage value) of the input analog signal using the one-bit data stream, and compares the estimate with a pre-determined threshold. In the illustrated embodiments, the value of the analog input signal is within a pre-determined range that is smaller than a full-scale input range of the ADC circuit. When there is an open pin condition at the input port (e.g., the analog input signal being disconnected from the input port), the voltage at the input port of the ADC circuit is pulled up by the pull-up circuit to a voltage value that is outside the pre-determined range. The open pin detection circuit detects the open pin condition by detecting that the estimate of the analog signal crosses the pre-determined threshold.

Figure 1:
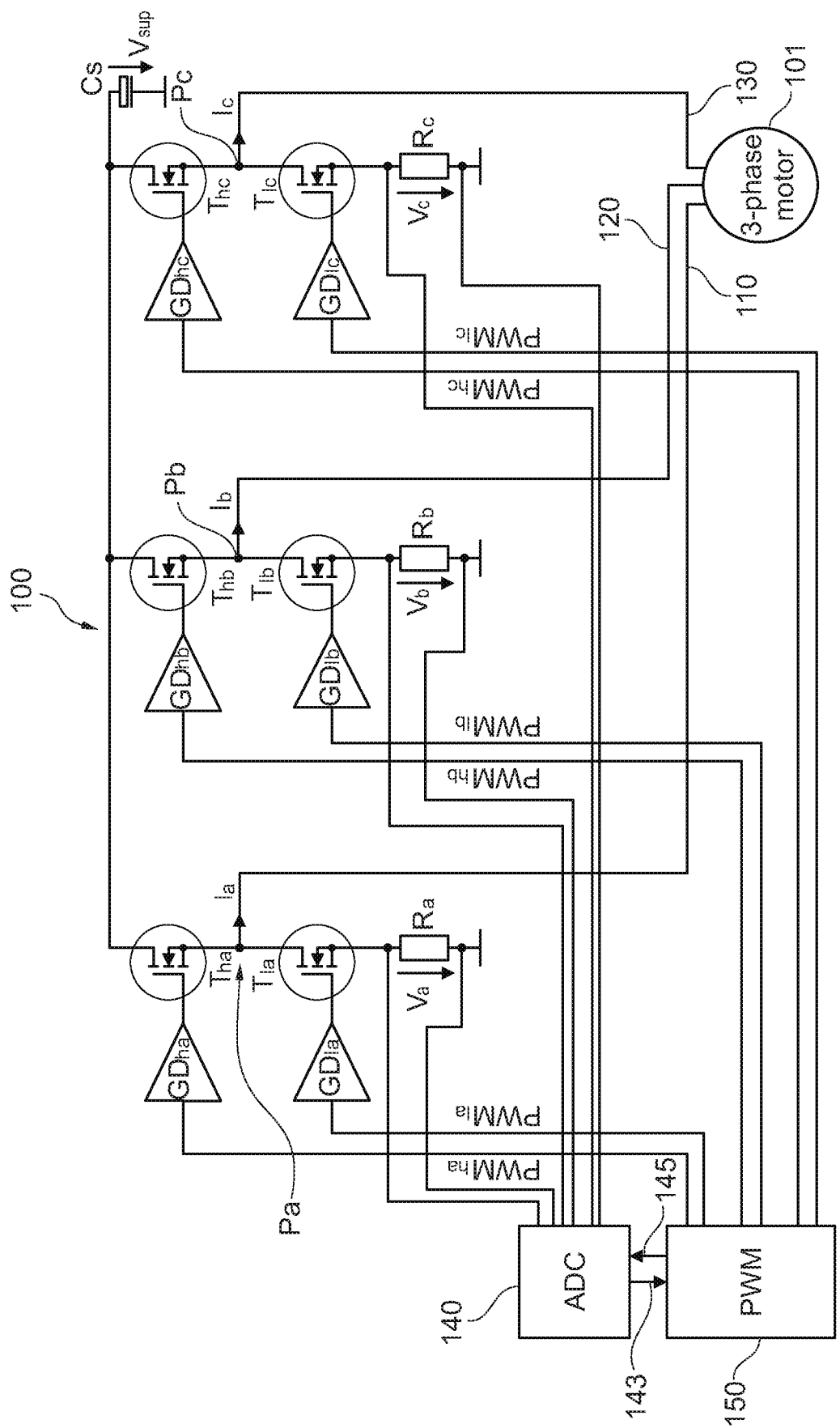
FIG. 1 illustrates a schematic view of a three-phase motor system, in an embodiment.

Referring to FIG. 1, a motor system 100 includes an AC motor 101 (e.g., a three-phase motor) connected to a power supply $V_{supp}$ (illustrated as a voltage $V_{sup}$ across capacitor $C_s$) via three half bridges. Each of the three half bridges includes a high-side switch (e.g., $T_{ha}$, $T_{hb}$ or $T_{hc}$) coupled in series with a low-side switch (e.g., $T_{la}$, $T_{lb}$ or $T_{lc}$), with the high-side switch coupled to the higher potential terminal of the power supply $V_{sup}$ and the low-side switches coupled to the lower potential terminal of the power supply. For example, a first half bridge includes a high-side switch $T_{ha}$ coupled in series with a low-side switch $T_{la}$. In the first half bridge, a gate of the high-side switch $T_{ha}$ is coupled to the output of a gate driver $GD_{ha}$, a drain terminal of the high-side switch $T_{ha}$ is coupled to the power supply $V_{sup}$, and a source terminal of the high-side switch $T_{ha}$ is coupled to a drain terminal of the low-side switch $T_{la}$. A gate of low-side switch $T_{la}$ is coupled to an output of a gate driver $GD_{la}$, and a source of the low-side switch $T_{la}$ is coupled to the lower potential terminal (e.g., electrical ground) via a shunt resistor $R_a$. The source terminal of the high-side switch $T_{ha}$ connects with the drain terminal of the low-side switch $T_{la}$ at node $P_a$, which is also referred to a phase node $P_a$. The topologies of the second half bridge and the third half bridge are similar to that of the first half bridge, thus are not repeated here. As illustrated in FIG. 1, the three phases of the AC motor 101 are coupled to phase nodes $P_a$, $P_b$ and $P_c$, respectively, via three electrically conductive paths (e.g., electrical wires) 110, 120 and 130.

The AC motor 101 may be any kind of multi-phase motor (e.g., more than three phases), and a three-phase motor is merely an example. The AC motor 101 may be a synchronous motor, an induction motor, a switched reluctance motor, or the like. The disclosed embodiments use three-phase motors as examples, with the understanding that other types of AC motors may also be used and are within the scope of the present disclosure.

As illustrated in FIG. 1, shunt voltage $V_a$ across shunt resistors $R_a$, shunt voltage $V_b$ across shunt resistors $R_b$, and shunt voltage $V_c$ across shunt resistors $R_c$ are sent to an ADC module 140 and converted into digital values. The ADC module 140 may include one or more suitable analog-to-digital converters. For example, the ADC module 140 may have three Sigma-Delta ADCs, with each of the three Sigma-Delta ADCs converting one of the input analog signals (e.g., shunt voltages $V_a$, $V_b$ and $V_c$) into digital values. The output of the ADC module 140 represents the measured values of the input analog signals (e.g., $V_a$, $V_b$ and $V_c$), which measured values are sent to a PWM module 150 via a data path 143. The data path 143 is a multi-bit data path in some embodiments. The PWM module 150 controls the operation of the AC motor 101 by generating PWM pulses, also referred to as PWM control signals (e.g., $PWM_{ha}$, $PWM_{lb}$, $PWM_{hb}$, $PWM_{lb}$, $PWM_{hc}$, and $PWM_{lc}$), that control the operation of the high-side switches (e.g., $T_{ha}$, $T_{hb}$ and $T_{hc}$) and the low-side switches (e.g., $T_{la}$, $T_{lb}$ and $T_{lc}$), which in turn control the voltage and/or current supplied to the AC motor 101. The PWM pulses generated by the PWM module 150 may be buffered by the gate drivers (e.g., $GD_{ha}$, $GD_{la}$, $GD_{hb}$, $GD_{lb}$, $GD_{hc}$, $GD_{lc}$), and the outputs of the gate drivers are used to drive the high-side switches and the low-side switches. The PWM module 150 may be or include a micro-processor, a micro-controller, an application-specific integrated-circuit (ASIC) for motor control, as examples. The PWM module 150 monitors the status of the AC motor 101 by, e.g., monitoring measured values of shunt voltages $V_a$, $V_b$, and $V_c$ supplied by the ADC module 140, and generates PWM pulses to control the operation of the AC motor 101, in some embodiments.

In the example of FIG. 1, the high-side switches $T_{ha}$, $T_{hb}$ and $T_{hc}$ and the low-side switches $T_{la}$, $T_{lb}$ and $T_{lc}$ are illustrated as metal-oxide-semiconductor field-effect transistors (MOSFETs). Other suitable power switches, such as insulated-gate bipolar transistors (IGBTs), may also be used. The motor system 100 having three half bridges is merely an example, other typologies for a multi-phase motor system may also be used.

The principle of open pin detection in a signal acquisition system (e.g., an analogy-to-digital conversion system) disclosed herein may be applied to other applications besides motor control applications, such as a stand-alone ADC system, or ADC systems used in applications other than motor control applications. In addition, in embodiments of the present disclosure, three analog input signals (e.g., three shunt voltages) are converted into digital values in parallel, one skilled in the art will appreciate that the signal acquisition systems and methods disclosed herein can be used for any number of analog input signals, for example, less or more than three analog input signals. Furthermore, for a three-phase motor system (e.g., the motor system 100), it may be possible to only measure phase currents from two of the half-bridges, since the third phase current may be calculated, e.g., using Kirchhoff's law.

Figure 2:
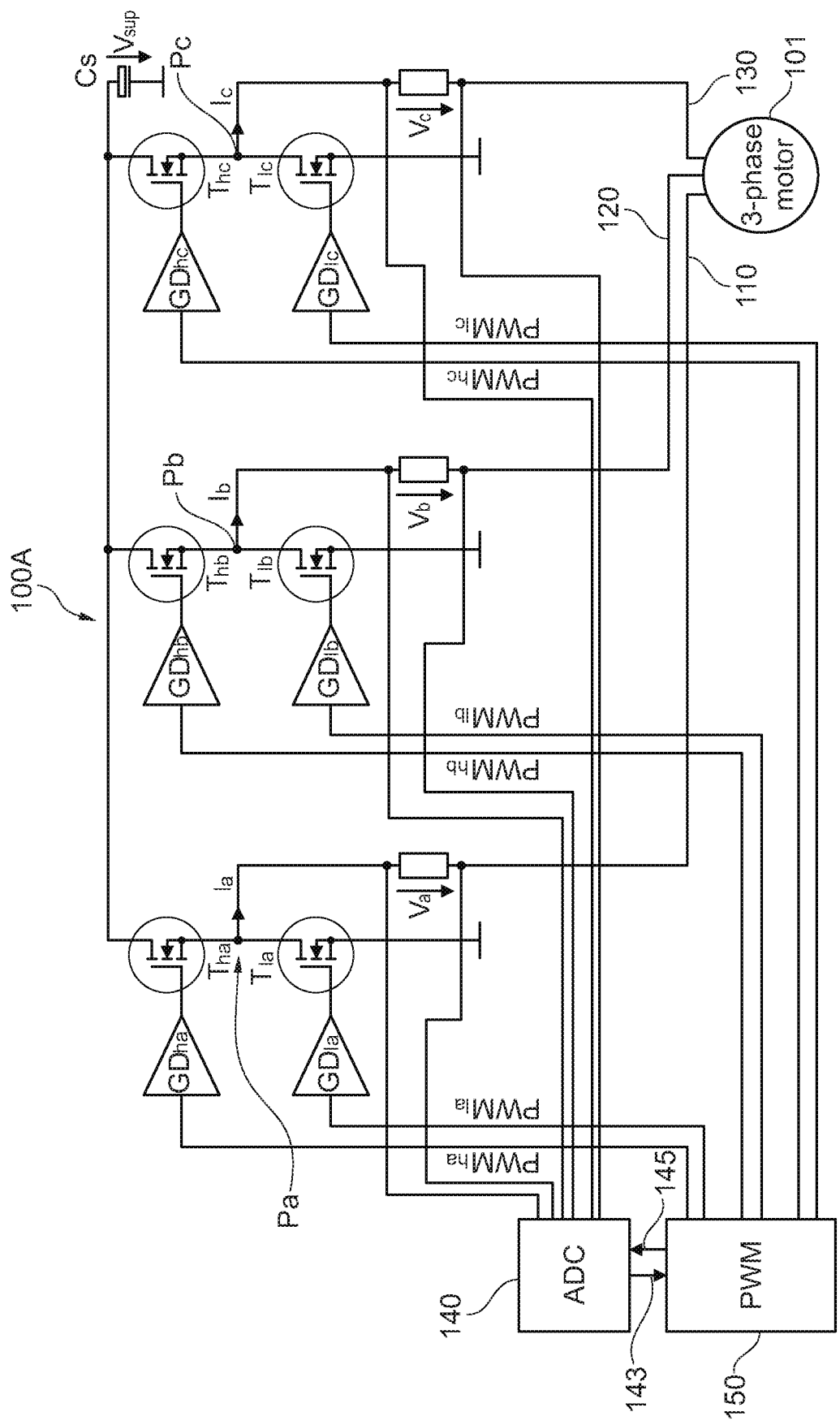
FIG. 2 illustrates a schematic view of a three-phase motor system, in another embodiment.

Still referring to FIG. 1, each phase current is measured by converting the corresponding shunt voltage into digital values, when the corresponding low-side switch is active (e.g., turned on) and the phase current flows through the shunt resistor. For example, to measurement phase current $I_a$, the shunt voltage $V_a$ across the shunt resistor $R_a$ is measured when the low-side switch $T_{la}$ is active (e.g., transistor $T_{la}$ is on). In the example of FIG. 1, the shunt resistors $R_a$, $R_b$ and $R_c$ are located in the low-side current path (e.g., between a low-side switch and a reference voltage level such as electrical ground), therefore phase currents flow through the shunt resistors when the low-side switches are active. Skilled artisans will appreciate that shunt resistors may be located in high-side current paths (e.g., between a high-side switch and power supply $V_{sup}$), in which case the phase currents may be measured when the high-side switches are active (e.g., turned on). In yet another embodiment, the shunt resistors are located in the conductive paths 110/120/130 between the phase nodes $P_a$, $P_b$, $P_c$ and the AC motor 101, as illustrated in motor system 100A of FIG. 2.

As described above, for closed-loop control of the AC motor 101, the PWM module 150 may use real-time data of the shunt voltages $V_a$, $V_b$, and $V_c$ provided by the ADC module 140. However, if an analog input at the input port of the ADC module 140 gets disconnected (also referred to as an open pin condition, or an open circuit condition), e.g., due to a faulty connection between the ADC module 140 and a shunt resistor, the output of the ADC module 140 no longer reflects the shunt voltage, and the PWM module 150 may generate incorrect control signals for the AC motor 101. If the open pin condition is not detected quickly and an error-mitigation procedure (e.g., an emergency shut-down procedure) is not initiated quickly, damage to the motor system may occur. Therefore, it is advantageous for an ADC circuit to be able to detect the open pin condition in real-time while the ADC circuit is operating, such that damage to the motor system may be avoided and repair work to fix the open pin condition may be carried out timely. Another advantage of having the real-time open pin detection capability is that there is no need to stop the normal operation of the motor system 100 such that a test mode can be entered to check for open pin condition.

Figure 3:
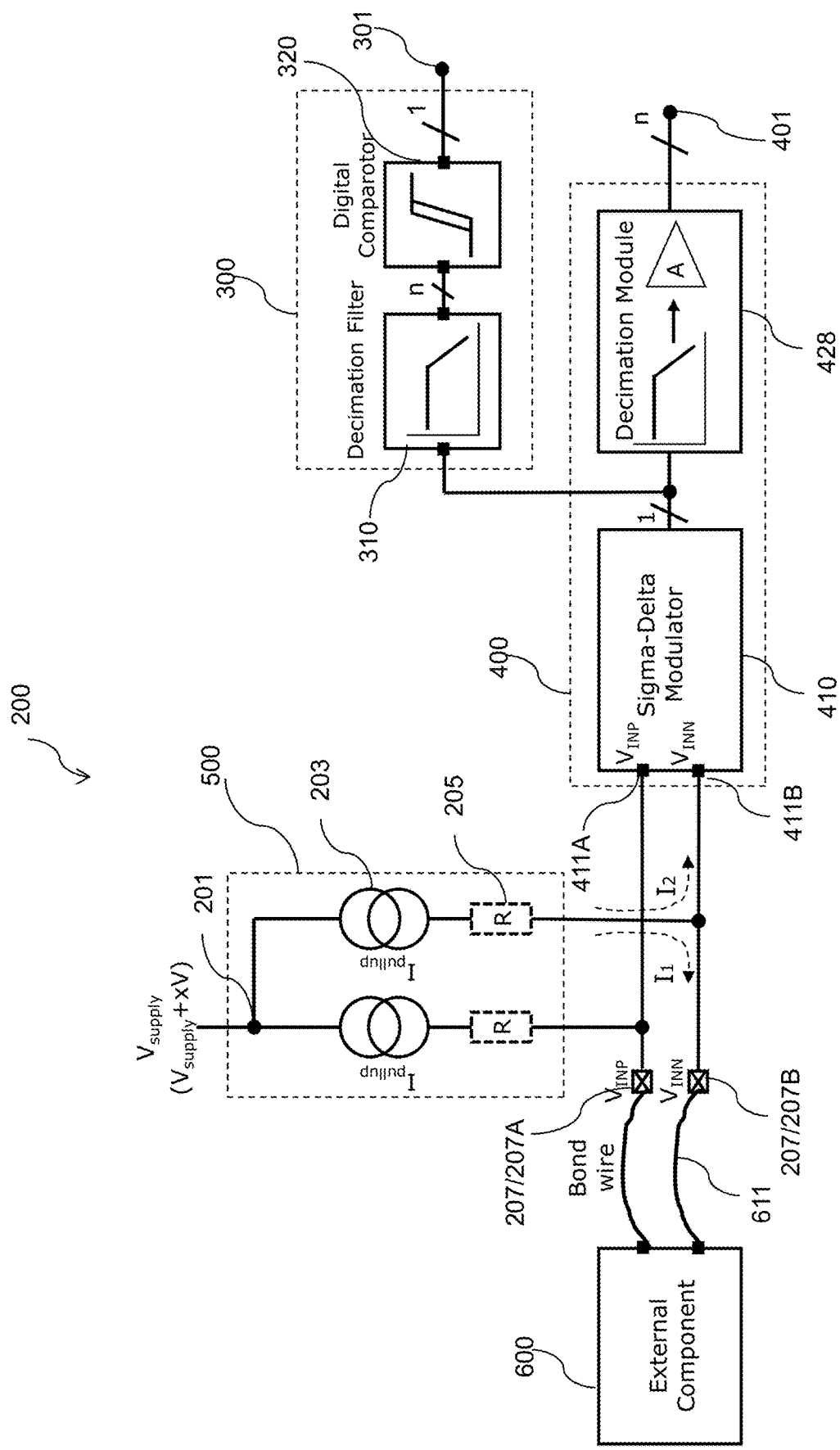
FIG. 3 illustrates a block diagram of an analog-to-digital converter (ADC) circuit having an open pin detection circuit, in an embodiment.

FIG. 3 illustrates a block diagram of an analog-to-digital converter (ADC) circuit 200 having an open pin detection circuit, in an embodiment. Note that to illustrate the connection between the ADC circuit 200 and external circuits, FIG. 3 also illustrates an external component 600 (e.g., a shunt resistor, a board, a sensor, or the like) and bond wires 611 coupling the external component 600 to the ADC circuit 200, which external component 600 and bond wires 611 are not part of the ADC circuit 200. In some embodiments, the ADC circuit 200 is used to measure the shunt voltage across the shunt resistor in the motor systems 100 or 100A. For example, the ADC module 140 in FIG. 1 (or FIG. 2) may include three instances of the ADC circuit 200, where each instance of the ADC circuit 200 is used to measure a respective shunt voltage.

As illustrated in FIG. 3, the ADC circuit 200 includes an input port 207, a Sigma-Delta ADC circuit 400, an open pin detection circuit 300, and a pull-up circuit 500. In the example of FIG. 3, the input port 207 is a differential input port with input terminals 207A and 207B, which input terminals are connected to the external component 600, e.g., connected to the two terminals of a shunt resistor in FIG. 1 or FIG. 2. Although differential input port is illustrated in FIG. 3, the principles of the present disclosure may be applied to single-ended input port, as skilled artisans readily appreciate.

In some embodiments, the value (e.g., shunt voltage value) of the analog input signal at the input port 207 is within a pre-determined range that is smaller than the maximum input range (also referred to as a full-scale range, a full-scale input range, or a full-scale input voltage range) of the Sigma-Delta ADC circuit 400. For example, the Sigma-Delta ADC circuit 400 may be able to accept an analog voltage signal within a maximum input range between −10 V and 10V, but the analog voltage supplied to the input port 207 may be within a pre-determined range between, e.g., −5V and 5 V, or −7 V and 7 V. This smaller, pre-determined range is chosen to avoid signal quality degradation of the ADC output near full-scale, which is illustrated in FIG. 6.

Figure 6:
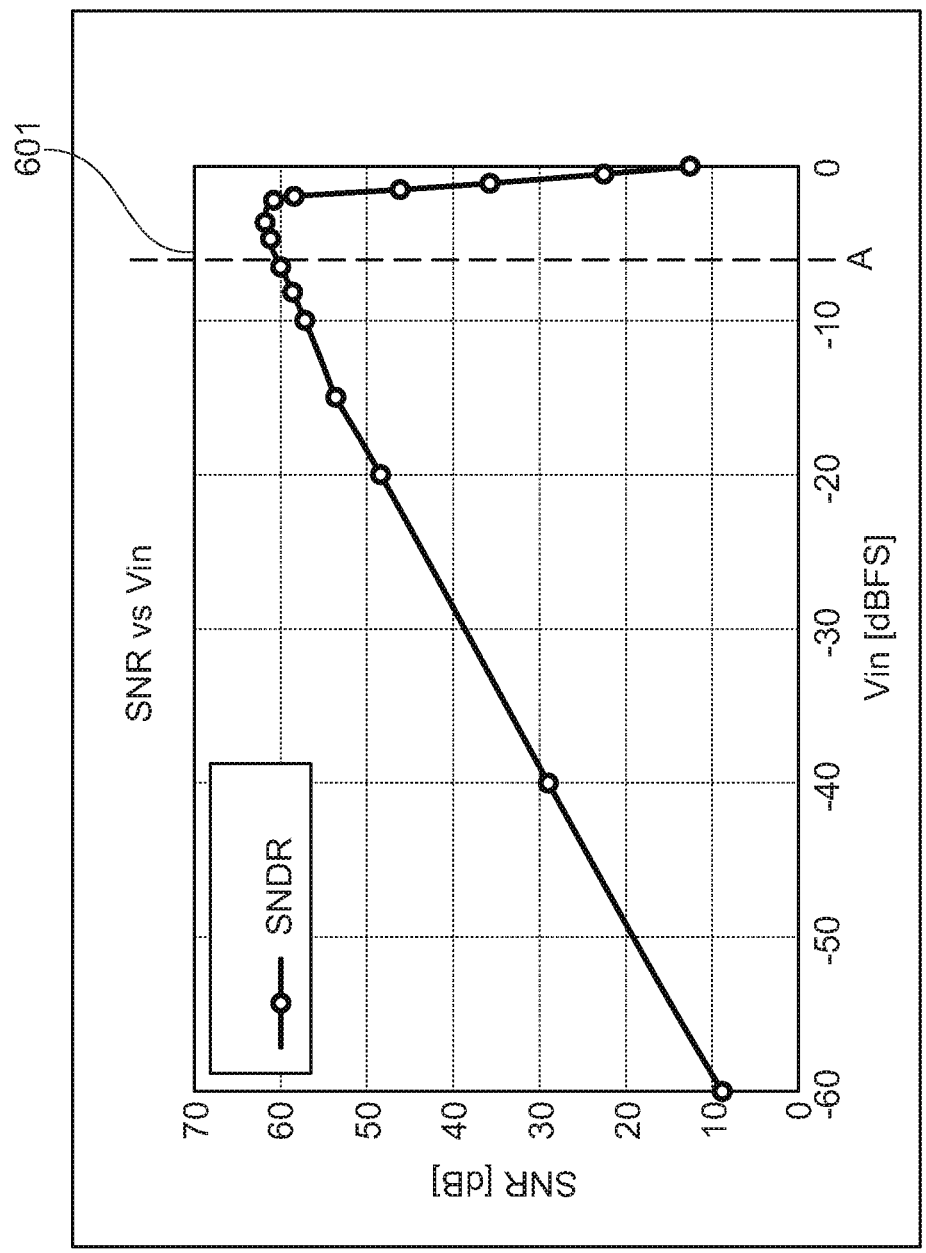
FIG. 6 illustrates the signal-to-noise-and-distortion ratio (SNDR) of an ADC output versus the input signal range, in some embodiments.

Referring temporarily to FIG. 6, which illustrates the signal-to-noise-and-distortion ratio (SNDR) of the output of a typical ADC circuit versus the input analog signal amplitude, in some embodiments. In FIG. 6, the x-axis illustrates the amplitude (e.g., the absolute value of the amplitude) of the input analog signal, and the y-axis illustrates the SNDR. The unit of the input analog signal amplitude is Decibels Relative to Full Scale (dBFS), which is a normalized value showing the ratio (in dB) between the amplitude of the input analog signal and the maximum input amplitude (e.g., full-scale input voltage). FIG. 6 shows that up to an input amplitude of A, where A may be, e.g., −6 dBFS or −3 dBFS, the SNDR increases as the amplitude of the input analog signal increases. However, the SNDR decreases drastically as the input amplitude approaches the full-scale input level (0 dBFS). For this reason, the amplitude of the input analog signal for an ADC circuit is generally controlled to be within a pre-determined range, where the maximum amplitude of the pre-determined range is a few dB (e.g., 3 dB or 6 dB) below the full-scale input level. In the motor system 100 or 100A, the shunt voltages sent to the ADC module 140 may be controlled to be within a pre-determined range smaller than the full-scale input range of the ADC module 140, which may be achieved by limiting the electrical currents flowing through the shunt resistors, or by specifying the resistances of the shunt resistors such that voltages across the shunt resistors are within the pre-determined range of the ADC during normal operation of the system.

Figure 7:
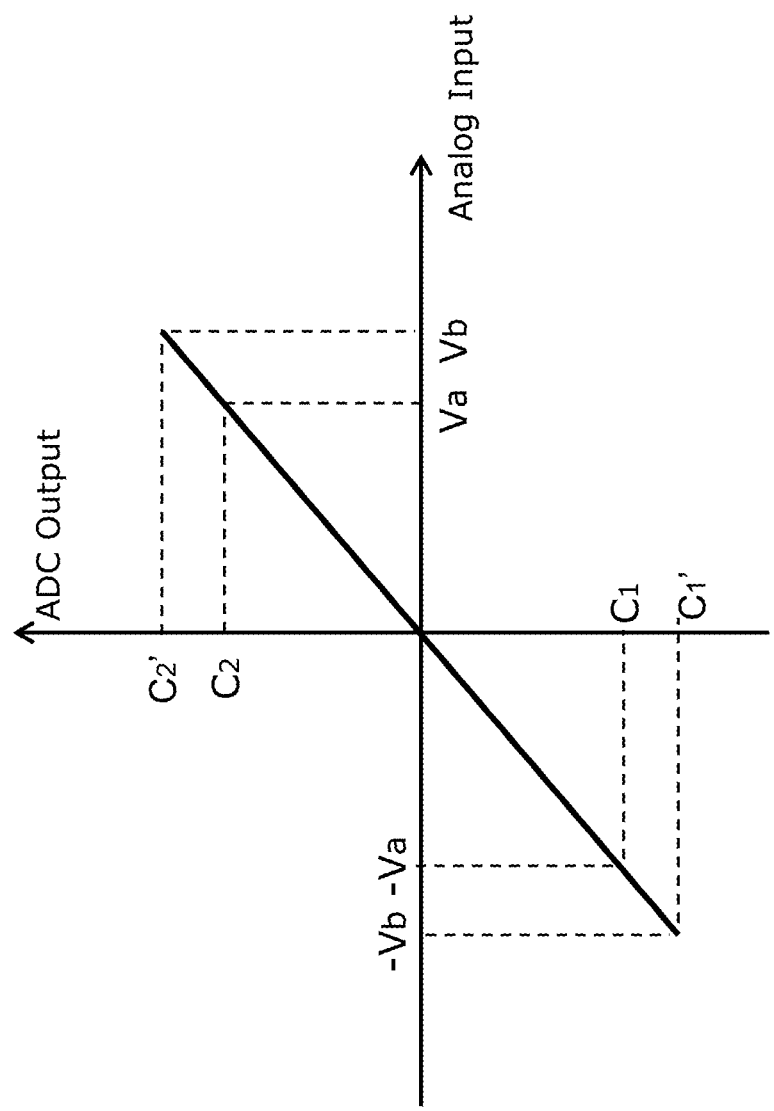
FIG. 7 illustrates the output of an ADC circuit versus the analog input, in an embodiment.

FIG. 7 illustrates the digital output of an ADC circuit (e.g., the Sigma-Delta ADC circuit 400 in FIG. 3) versus the value of the analog input signal, in an embodiment. In FIG. 7, the x-axis illustrates the voltage of the analog input signal, and the y-axis illustrates the output of ADC circuit. The output of the ADC circuit may have a multi-bit value. For example, for an ADC circuit with a 16-bit resolution, the output may be represented in the format of 0x0000-0xFFFF in hexadecimal format, where each of the outputs corresponds to an analog input signal value. Each of the digital output (e.g., 0x0000) may be referred to as an output code of the ADC circuit, and all possible codes form the code space of the ADC circuit. The ADC circuit may have other resolutions, such as an 8-bit resolution or a 32-bit resolution, as examples.

In the example of FIG. 7, the hardware of the ADC circuit is configured to have a full-scale analog input range between −Vb volt and Vb volt. The analog input to the ADC circuit, however, is controlled to be within a (smaller) pre-determined range between −Va volt and Va volt, in order to avoid signal degradation (see discussion above with reference to FIG. 6) near full scale, where Va and Vb are positive values, and Vb>Va. For example, Va may be 3 dB or 6 dB smaller than Vb. In other words, Va may be smaller than Vb by a pre-determined percentage. Due to the smaller input analog signal range (e.g., between −Va volt and Va volt), the output codes of the ADC circuit may between code C1 and code C2, and may not cover the fully code space without additional processing (e.g., scaling). In some embodiments, a gain adjustment module of the ADC circuit, such as the gain adjustment module 430 of the Sigma-Delta ADC circuit 400 in FIG. 4 (discussed hereinafter), scales (e.g., multiplies, or shifts) the output code of the ADC circuit such that the final output code (e.g., at output port 401 of FIG. 4) covers the fully code space. For example, due to the scaling of the gain adjustment module 430, the upper boundary (e.g., Va) of the pre-determined input range generates an output code of C2' (e.g., a maximum output code corresponding to an input analog signal value of Vb), and the lower boundary (e.g., −Va) of the pre-determined input range generates an output code of C1' (e.g., a minimum output code corresponding to an input analog signal value of −Vb). In other embodiments, the gain adjustment module of the ADC circuit scales the output codes of the ADC circuit, but the scaled output codes still do not cover the full code space between code C1' and code C2'.

Referring back to FIG. 3, besides being connected to the input port 411 of the Sigma-Delta ADC circuit 400, the input port 207 of the ADC circuit 200 is also connected to the pull-up circuit 500. The pull-up circuit 500 (may also be referred to as a pin biasing circuit) includes current sources 203, and may optionally include resistors 205 (shown in phantom). In the example of FIG. 3, each of the input terminals 207A/207B is coupled to a voltage supply $V_{supply}$ (e.g., about 14 V) through a current source 203 and a resistor 205. In some embodiments, the resistors 205 are omitted in the pull-up circuit, as in shown with respect to the pull-up circuit 500' in FIG. 8, where each of the input terminals 207A/207B is coupled to the voltage supply $V_{supply}$ through a current source 203. In yet another embodiment, the current sources 203 are omitted in the pull-up circuit, as is shown with respect to the pull-up circuit 500'' in FIG. 9, where each of the input terminals 207A/207B is coupled to the voltage supply $V_{supply}$ through a resistor 205 (also referred as a pull-up resistor).

The current source 203 may provide an electrical current that is orders of magnitude smaller than the current flowing through the shunt resistor $R_a$, $R_b$, and $R_c$. For example, the current source 203 may provide a current of about 250 μA. In contrast, the electrical current flowing through the shunt resistors $R_a$, $R_b$, and $R_c$ may be about 150 A. The shunt resistors may have a small electrical resistance, such as around 1 mΩ, and therefore, the shunt voltages across the shunt resistors are within a few volts, in the illustrated embodiments. In an embodiment where the pull-up circuit 500 includes the current source 203 and the resistors 205, the resistor 205 may have a small resistance of, e.g., about 1Ω. In embodiments where the pull-up circuit 500 only includes resistors 205 (see FIG. 9), the resistor 205 may have a resistance of, e.g., about 56 kΩ.

During normal operation of the ADC circuit 200, the input port 207 is connected to the external component 600 (e.g., shunt resistor), and the analog signal at the input port 207 (e.g., shunt voltage) is sent to input terminals 411A/411B of the Sigma-Delta ADC circuit 400 and converted into digital data. Electrical currents from the current sources 203 flow out of the input port 207 toward the external component 600, as illustrated by current $I_1$ in FIG. 3. Note that for clarity, current (e.g., $I_1$ and $I_2$) from only one branch of the pull-up circuit 500 is illustrated in FIG. 3, with the understanding that the same or similar current flow occurs in the other branch of the pull-up circuit 500. Since the current provided by the current source 203 is very small (e.g., about 250 μA) compared with the current (e.g., about 150 A) flowing through the shunt resistor, the current $I_1$ has negligible effect on the operation of the external component 600. In embodiments where a pull-down circuit is used instead of the pull-up circuit 500, the directions of the electrical currents $I_1$ and $I_2$ may be opposite of the illustrated directions in FIG. 3.

When an open pin condition occurs, e.g., the bond wire 611 is broken or the external component is disconnected, the currents from the current sources 203 flow toward the Sigma-Delta ADC circuit 400, as illustrated by the current $I_2$. The voltage at the input terminal (e.g., 207B) is now pulled up to a voltage same as, or close to, the supply voltage $V_{supply}$ (e.g., 14 V) by the pull-up circuit 500. Therefore, when the open pin condition occurs, the magnitude of the voltage difference between the input terminals 207A and 207B may be close to the supply voltage $V_{supply}$, such as being about 13V, which is higher than the normal voltage difference of, e.g., a few volts.

As discussed above, when an open pin condition occurs at an input terminal of the ADC circuit 200, the pull-up circuit 500 pulls up the voltage at the input terminal to the supply voltage level, which is higher than the normal voltage at the input terminal without open pin condition. As a result, the Sigma-Delta ADC circuit 400 produces digital outputs that are outside a normal range. The open pin detection circuit 300 monitors the digital outputs from the Sigma-Delta modulator 410, and detects the open pin condition by detecting that the digital outputs are outside the normal range. Details of this detection are discussed hereinafter.

The analog signal at the input port 207 (e.g., shunt voltage) is sent to input terminals 411A/411B of the Sigma-Delta ADC circuit 400. A Sigma-Delta modulator 410 of the Sigma-Delta ADC circuit 400 converts the input analog signal into a data stream, which is a one-bit data stream in some embodiments. Alternatively, the data stream may be a multi-bit data stream. The date stream (e.g., the one-bit data stream) from the Sigma-Delta modulator 410 is then converted into multi-bit data by the decimation module 428 of the Sigma-Delta ADC circuit 400. The open pin detection circuit 300 forms an estimate of the value (e.g., shunt voltage value) of the input analog signal using the one-bit data stream, and compares the estimate with a pre-determined threshold.

Turning to FIG. 7, in the illustrated embodiments, the value (e.g., shunt voltage value) of the analog input signal during normal condition (e.g., no open pin condition) is within a pre-determined range between −Va and Va, where Va may be referred to as a pre-determined voltage threshold. When there is an open pin condition at a input terminal of the input port 207, the voltage at the input terminal is pulled up by the pull-up circuit 500 to a high voltage value $V_{supply}$ (e.g., same as or close to Vb). Since the analog input signal at the other input terminal of the input port 207 is small (e.g., less than 1 V due to the small shunt resistor and limited shunt current), the voltage difference between input terminals 207A and 207B is −Vc or Vc, depending on which terminal of the input port 207 has the open pin condition, where Vc is a value close to Vb (e.g., Va<Vc≤Vb). This large voltage difference (e.g., −Vc or Vc) is outside the pre-determined range (e.g., between −Va and Va) for normal condition, and causes the Sigma-Delta modulator 410 to generate outputs (e.g., the one-bit data stream) that are different from outputs corresponding to the normal analog input range (e.g., between −Va and Va). For example, the outputs of the Sigma-Delta modulator 410 may include large numbers of consecutive ones or zeros.

The open pin detection circuit 300 forms an estimate of the input analog signal (e.g., shunt voltage) using a decimation filter 310, which converts the one-bit data stream from the Sigma-Delta modulator 410 into a multi-bit data stream (at a lower data rate). The output of the decimation filter 310 is then compared, using a comparator 320, with a pre-determined threshold to detect that the analog input signal has a value outside the pre-determined range for normal condition, which indicates an open pin condition. Note that the pre-determined threshold may include a first threshold corresponding to a first analog signal value higher than the upper bound of the pre-determined range, and may include a second threshold corresponding to a second analog signal value lower than the lower bound of the pre-determined range. For the example discussed above, the pre-determined range of the input analog signal for normal condition is between −Va and Va, and therefore, the first threshold may correspond to an analog input signal value between Va and Vc, and the second threshold may correspond to an analog input signal value between −Vc and −Va. In other words, if the output of the decimation filter 310 indicates that the input analog signal crosses (e.g., increases above) the first threshold, or that the input analog signal crosses (e.g., decreases below) the second threshold, then an open pin condition is detected. Therefore, the open pin detection circuit 300 works in parallel (e.g., at the same time) with the Sigma-Delta ADC circuit 400 without affecting the normal operation of the Sigma-Delta ADC circuit.

The comparator 320 of the open pin detection circuit 300 may be any suitable digital comparator for comparing the output of the decimation filter 310 with the pre-determined threshold. Details of the decimation filter 310 are discussed below after the discussion of the Sigma-Delta ADC circuit 400. In some embodiments, the ADC circuit 200 is integrated in an integrated circuit (IC) device (e.g., an IC device formed on a single semiconductor substrate, such as a silicon substrate), in which case the IC device can detect the open pin condition without using external components. In some embodiments, the open pin detection circuit 300 is implemented using analog components. For example, an analog low-pass filter may be used as the decimation filter 310 to convert the one-bit data stream into an analog output signal (e.g., analog voltage value), and the comparator 320 may be an analog comparator.

Figure 4:
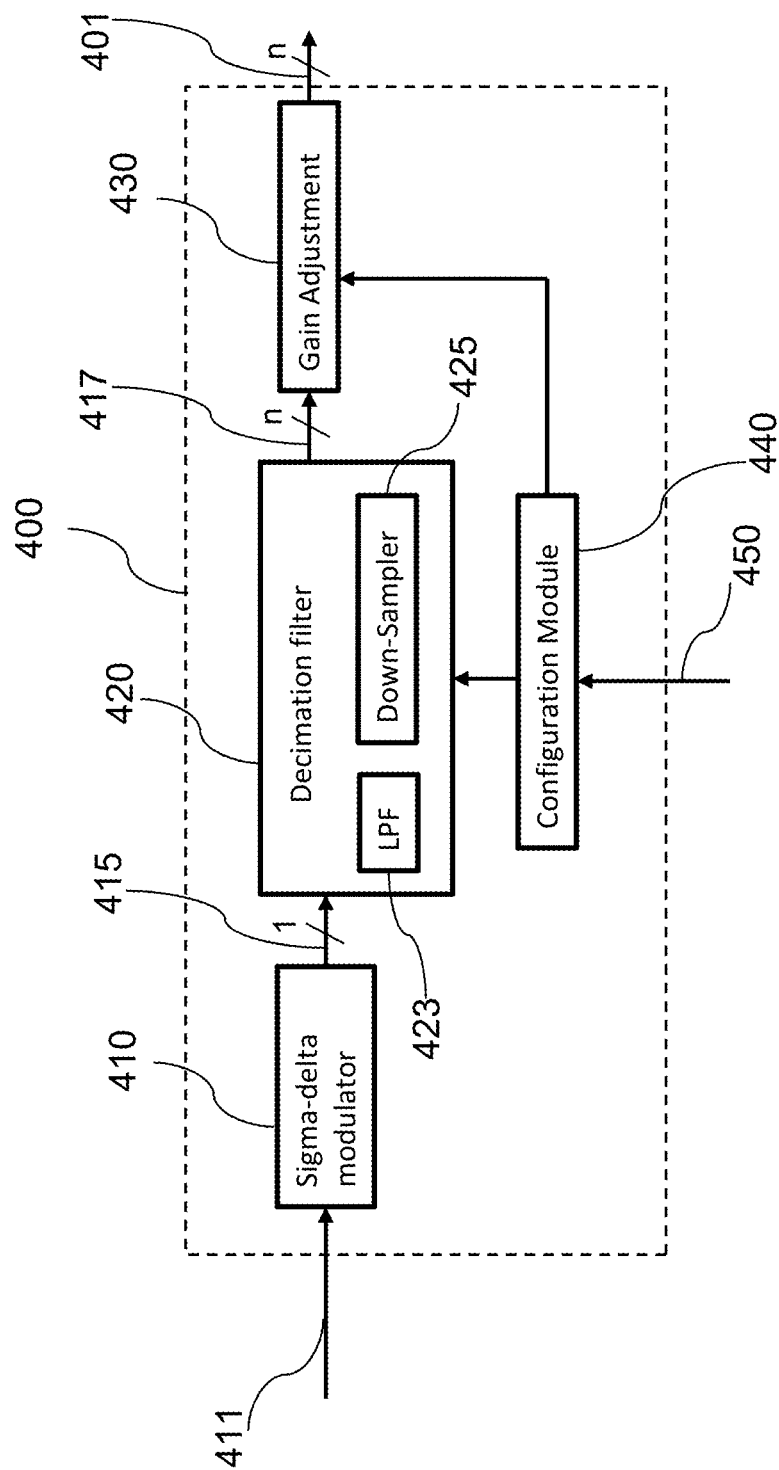
FIG. 4 illustrates a block diagram of a Sigma-Delta ADC circuit, in an embodiment.

Referring now to FIG. 4, which illustrates a block diagram of the Sigma-Delta ADC circuit 400, in accordance with an embodiment. As illustrated in FIG. 4, the Sigma-Delta ADC circuit 400 includes a Sigma-Delta modulator 410, a decimation filter 420, a gain adjustment module 430 and an optional configuration module 440. The decimation filter 420 and the gain adjustment module 430 correspond to the decimation module 428 in FIG. 2. The Sigma-Delta modulator 410 samples the analog input signal at input port 411 at a sampling frequency $f_s$ and turns the analog input signal into a one-bit digital stream (e.g., a sequence of digital data with 1-bit resolution) at output 415. The sampling rate $f_s$ is usually much higher (e.g., at least an order of magnitude larger) than the Nyquist sampling frequency of the analog input signal. For example, for a three-phase motor system with a phase frequency of about 20 KHz, the Sigma-Delta modulator sampling frequency $f_s$ may be about 20 MHz. A large sampling frequency allows the use of a simple low-pass filter in the decimation filter 420 and provides a higher bit resolution at the output of decimation filter 420, in some embodiments. The Sigma-Delta modulator 410 may be a continuous-time Sigma-Delta modulator or a discrete-time Sigma-Delta modulator. Sigma-Delta modulator is known in the art and details are not repeated here.

Still referring to FIG. 4, decimation filter 420 includes two functional modules: a low-pass filter (LPF) 423 and a down-sampler 425 (also referred to as decimator 425). For hardware implementation, the LPF 423 and the down-sampler 425 may be implemented in a same circuit module or hardware module, although the LPF 423 and the down-sampler 425 may also be implemented in different circuit modules or hardware modules. The LPF 423 has a digital cut off frequency of $\pi/D$, where $\pi$ is the normalized digital frequency (in radians/second) corresponding to half of the sampling frequency $f_s$, and D is the decimation factor of the decimator 425. The LPF 423 may be built using any suitable filter, such as an infinite impulse response (IIR) filter, a finite impulse response (FIR) filter, a SINC filter, a comb filter, a cascade integrator-comb (CIC) filer, or the like. The LPF 423 reduces or removes frequency components of its input signal (e.g., the one-bit digital stream) above the digital frequency $\pi/D$, and prevents aliasing in the decimation process when the output of the LPF 423 is down-sampled (also referred to as decimated) by the down-sampler 425.

The down-sampler 425 reduces the sampling frequency of a digital signal by a factor of D (also referred to as decimation factor D, decimation rate D, and down-sampling factor D). The decimation filter 420 may include multiple stages of processing (not shown in FIG. 4), with each stage having an LPF and a decimator. Besides removing frequency components of the digital stream at the output 415 of the Sigma-Delta modulator 410 that is above the digital frequency $\pi/D$, the LPF 423 also functions to "average" its input signal, thereby converting the one-bit digital stream into multi-bit digital values. The multi-bit digital values from LPF 423 is decimated by a factor of D by the decimator 425, and n-bit digital values are sent out at data path 417 of the decimation filter 420.

FIG. 4 shows a gain adjustment module 430 coupled to the output of the decimation filter 420. The gain adjustment module 430 includes a multiplier that multiplies the output of decimation filter 420 by a scaling factor, in some embodiments. In other embodiments, the gain adjustment module 430 includes a divider unit to output a normalized data format. With either a multiplier or a divider, gain adjustment scales the output of the decimation filter 420 by a scaling factor. In some embodiment, the gain adjustment module 430 is integrated with the decimation filter 420 in a same hardware module. For example, the decimation filter 420 may have a built-in gain factor which achieves the function of the gain adjustment module 430.

The configuration module 440, which is optional, sets the configuration of the decimator filter 420 and the scaling factor of the gain adjustment module 430, in some embodiments. An external interface 450 allows the configuration module 440 to be controlled by a controller, e.g., the PWM module 150 in FIG. 1. In some embodiments, the configuration module 440 is omitted, and the configuration of the decimator filter 420 and the gain adjustment module 430 are hard wired. In other embodiments, the configuration parameters of the decimator filter 420 and the gain adjustment module 430 are stored in a memory (e.g., a non-volatile memory) and loaded into configuration registers of the Sigma-Delta ADC circuit 400 during power-up or reset of the hardware.

Figure 5:
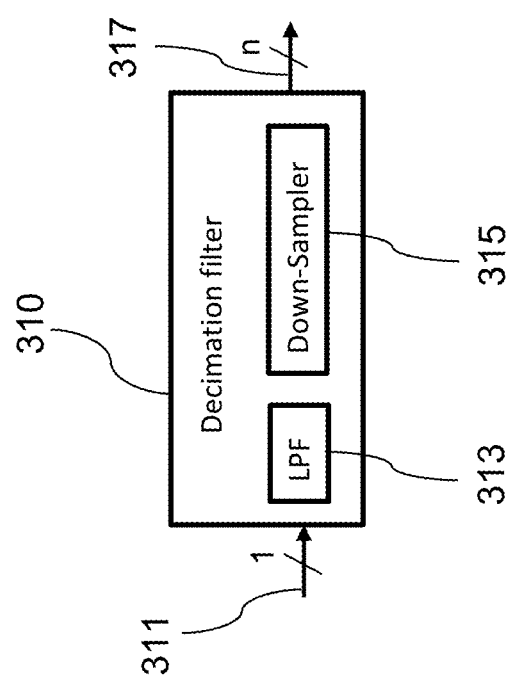
FIG. 5 illustrates a block diagram of a decimation filter of the open pin detection circuit of FIG. 3, in an embodiment.

FIG. 5 illustrates a block diagram of the decimation filter 310 of the open pin detection circuit 300 of FIG. 3, in an embodiment. Similar to the decimation filter 420 of FIG. 4, the decimation filter 310 includes an LPF 313 and a down-sampler 315, which down-sampler 315 may be optional. In some embodiments, the LPF 313 and the down-sampler 315 are the same as or similar to the LPF 423 and the down-sampler 425, respectively, thus details may not be repeated. Note that since the function of the decimation filter 310 is to form an estimate of the input analog signal (instead of obtaining a high-resolution digital output), the decimation filter 310 may have a simpler structure than the decimation filter 420. For example, the LPF 313 of the decimation filter 310 may have lower filter orders, fewer filter taps, and/or fewer filter stages in the filter design than the LPF 423 of FIG. 4. As a result, the number of bits (also referred to as bit resolution) of the output 317 of the decimation filter 310 may be lower than that of the decimation filter 420. Therefore, the same analog input signal value at the input port 207 of the ADC circuit 200 may correspond to different output codes (e.g., having different resolutions) at the outputs of the decimation filters 420 and 310. In some embodiments, the decimation filter 310 has a unit gain, which is smaller than the gain of the decimation module 428.

Figure 8:
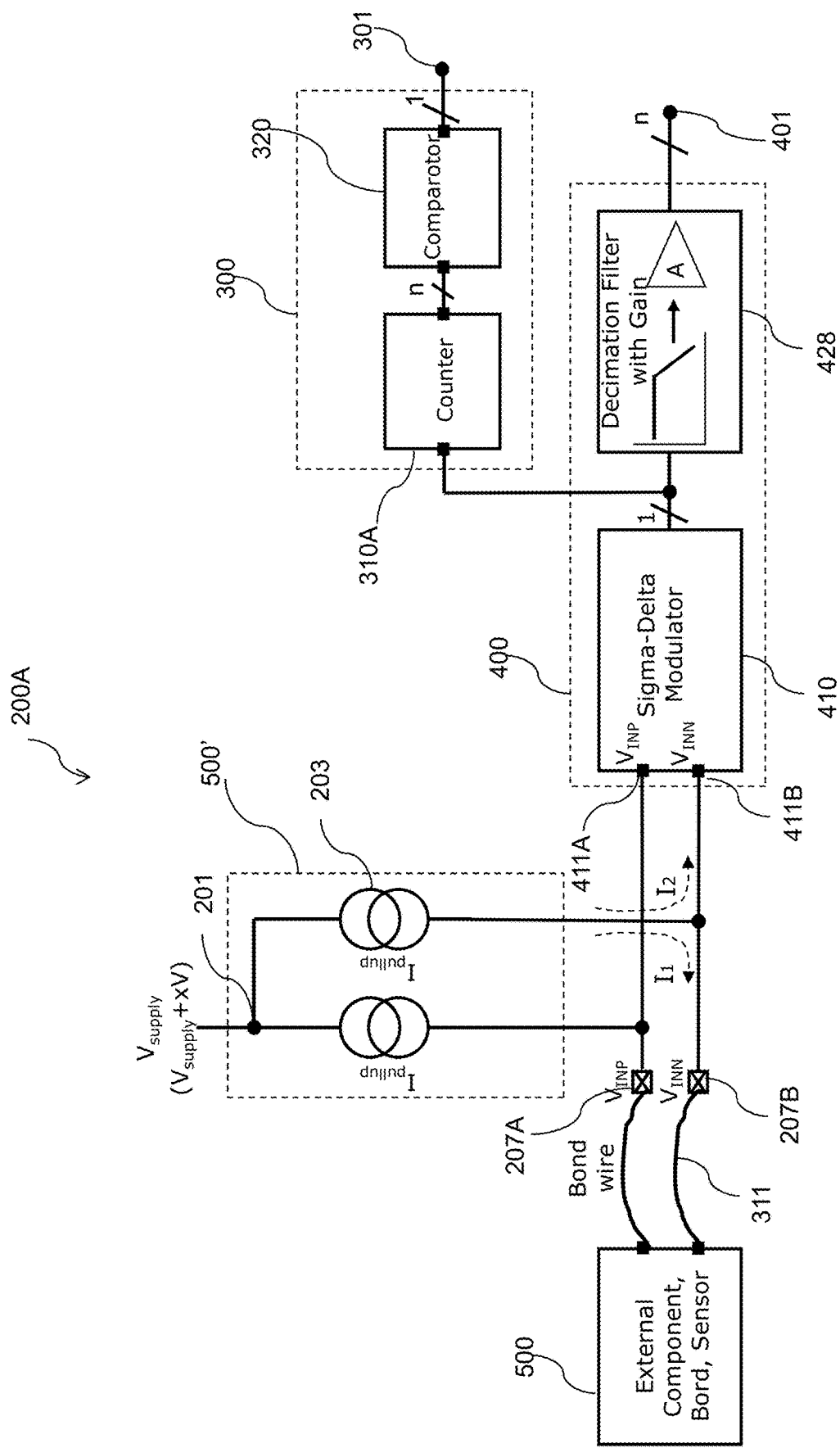
FIG. 8 illustrates a block diagram of an analog-to-digital converter (ADC) circuit having an open pin detection circuit, in another embodiment.

FIG. 8 illustrates a block diagram of an analog-to-digital converter (ADC) circuit 200A having an open pin detection circuit, in an embodiment. The ADC circuit 200A is similar to the ADC circuit 200 of FIG. 3, but with a counter 310A in place of the decimation filter 310 in the open pin detection circuit 300. In addition, the pull-up circuit 500 of FIG. 8 does not have the resistors 205 in FIG. 3.

In the embodiment of FIG. 8, the open pin detection circuit 300 forms an estimate of the input analog signal (e.g., the shunt voltage) using the counter 310A, which is configured to count the number of consecutive zeros and/or consecutive ones in the one-bit data stream from the Sigma-Delta modulator 410. For example, a small input analog signal may produce a long string of zeros in the one-bit data stream at the output of the Sigma-Delta modulator 410, and a large input analog signal may produce a long string of ones in the one-bit data stream. By counting the number of consecutive zeros and/or the number of consecutive ones in the one-bit data stream, the output of the counter 310A forms an estimate of the input analog signal, which is compared with a pre-determined threshold by the comparator 320 to detect the open pin condition. For example, the pre-determined threshold may be 60, which means that if sixty consecutive ones or consecutive zeros are detected (e.g., counted) in the one-bit stream by the counter 310A, then the comparator 320 may output a logic 1 to indicate detection of an open pin condition. The pre-determined threshold (e.g., 60) is determined by, e.g., the design of the Sigma-Delta modulator 410 and the threshold voltage, and is independent of the design (e.g., length, order, gain) of the decimation module 428, in the illustrated embodiment. In an alternative embodiment, the total number of ones and/or zeros (which may not be consecutive) that occur within a predetermined time period is counted, and if there are more than a predetermined number of ones and/or zeros in the measured time period, then an open pin condition is detected.

Figure 9:
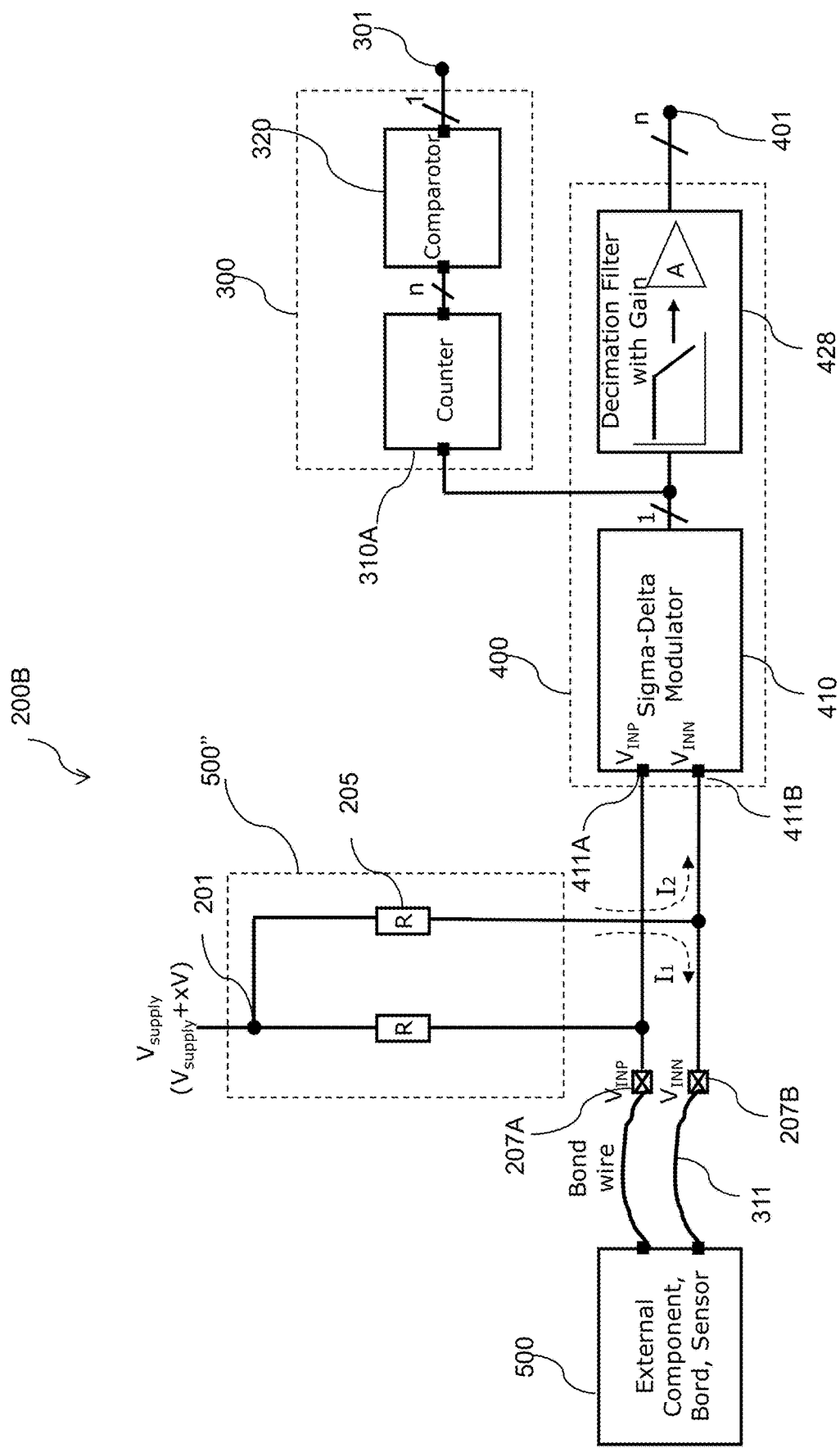
FIG. 9 illustrates a block diagram of an analog-to-digital converter (ADC) circuit having an open pin detection circuit, in yet another embodiment.

FIG. 9 illustrates a block diagram of an analog-to-digital converter (ADC) circuit 200B having an open pin detection circuit, in yet another embodiment. The ADC circuit 200B is similar to the ADC circuit 200A of FIG. 8, but with pull-up resistors 205 in the pull-up circuit 500. Note that the pull-up circuits 500, 500', and 500" may be used interchangeably in different embodiments. For example, the pull-up circuit 500' or the pull-up circuit 500" may be used in replace of the pull-up circuit 500 in FIG. 3, and vice versa. These and other variations are fully intended to be included within the scope of the present disclosure.

Figure 10:
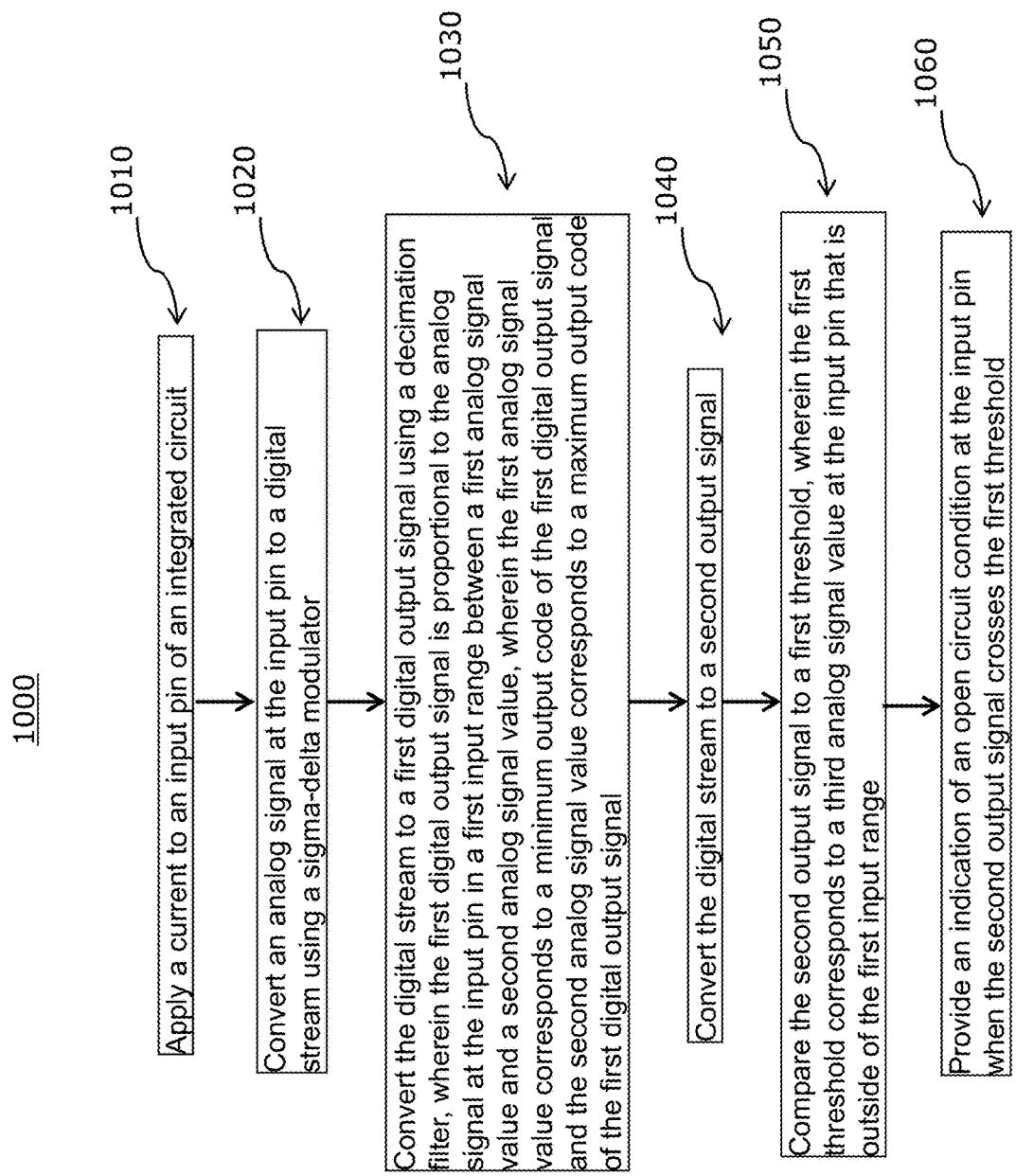
FIG. 10 illustrates a flow chart of a method of operating an ADC circuit, in some embodiments.

FIG. 10 illustrates a flow chart of a method 1000 of operating an ADC circuit, in some embodiments. It should be understood that the embodiment methods shown in FIG. 10 is an example of many possible embodiment methods. One of ordinary skill in the art would recognize many variations, alternatives, and modifications. For example, various steps as illustrated in FIG. 10 may be added, removed, replaced, rearranged and repeated.

Referring to FIG. 10, at step 1010, a current is applied to an input pin of an integrated circuit. For example, the current could be applied via a pull-up circuit (e.g., 500, 500', or 500") to the input pin. At step 1020, an analog signal at the input pin is converted to a digital stream using a Sigma-Delta modulator (e.g., 410). At step 1030, the digital stream is converted to a first digital output signal using a decimation filter (e.g., 420), where the first digital output signal is proportional to the analog signal at the input pin in a first input range between a first analog signal value and a second analog signal value, where the first analog signal value corresponds to a pre-determined range of the analog signal that is smaller than a full-scale input range of the analog signal. For example, the pre-determined range of the analog signal may be between −Va and Vb in FIG. 7, and the full-scale input range may be between −Vb and Vb. At step 1040, the digital stream is converted to a second output signal, e.g., by the open pin detection circuit 300. At step 1050, the second output signal is compared to a first threshold, wherein the first threshold corresponds to a third analog signal value at the input pin that is outside of the first input range. For example, the third threshold may be a value between Va and Vb in FIG. 7, or between −Vb and −Va. At step 1060, an indication of an open circuit condition at the input pin is provided when the second output signal crosses the first threshold.

Advantages of embodiments of the present invention include real-time detection of the open pin condition in an ADC circuit. The disclosed open pin detection circuit 300 operates in parallel with the Sigma-Delta ADC circuit 400 without affecting the operation of the Sigma-Delta ADC circuit. For example, the code range and the dynamic range of the Sigma-Delta ADC circuit 400 are not affected by the open pin detection circuit 300. In the illustrated embodiment, open pin conditions are detected in real-time, and there is no need to stop the normal operation of the Sigma-Delta ADC circuit 400 to enter a test mode to check for open pin condition. The ADC circuit with the open pin detection capability can be integrated into an integrated circuit (IC), in which case open pin conditions can be detected using the IC without the need for external components.

Example embodiments of the present invention are summarized here. Other embodiments can also be understood from the entirety of the specification and the claims filed herein.

Example 1

In an embodiment, a method includes applying a current to an input pin of an integrated circuit; converting an analog signal at the input pin to a digital stream using a Sigma-Delta modulator; converting the digital stream to a first digital output signal using a decimation filter, wherein the first digital output signal is proportional to the analog signal at the input pin in a first input range between a first analog signal value and a second analog signal value, wherein the first input range corresponds to a pre-determined range of the analog signal that is smaller than a full-scale input range of the analog signal; converting the digital stream to a second output signal; comparing the second output signal to a first threshold, wherein the first threshold corresponds to a third analog signal value of the analog signal at the input pin that is outside of the first input range; and providing an indication of an open circuit condition at the input pin when the second output signal crosses the first threshold.

Example 2

The method of example 1, wherein the input pin comprises a first input pin and a second input pin; applying the current to the input pin comprises applying a first current to the first input pin and applying a second current to the second input pin; and the Sigma-Delta modulator comprises a differential input coupled to the first input pin and the second input pin.

Example 3

The method of example 2, further comprising: comparing the second output signal to a second threshold, wherein the second threshold corresponds to a fourth analog signal value of the analog signal at the input pin that is outside of the first input range; and providing the indication of the open circuit condition at the input pin when the second output signal crosses the second threshold, wherein the third analog signal value is greater than the second analog signal value and the fourth analog signal value is less than the first analog signal value, and the second analog signal value is greater than the first analog signal value.

Example 4

The method of example 1, wherein applying the current to the input pin of the integrated circuit comprises using a pull-up resistor or a pull-down resistor.

Example 5

The method of example 1, wherein applying the current to the input pin of the integrated circuit comprises using a current source.

Example 6

The method of example 1, wherein the digital stream comprises a one-bit data stream.

Example 7

The method of example 6, wherein converting the digital stream to the second output signal comprises converting the digital stream to the second output signal using a counter.

Example 8

The method of example 6, wherein converting the digital stream to the second output signal comprises converting the digital stream to the second output signal using an analog low-pass filter.

Example 9

The method of example 1, wherein the first analog signal value corresponds to a minimum output code of the first digital output signal and the second analog signal value corresponds to a maximum output code of the first digital output signal.

Example 10

In an embodiment, an integrated circuit comprises a pin biasing circuit configured to provide a current to an input pin of the integrated circuit; a Sigma-Delta modulator having an input coupled to the input pin; a decimation filter coupled to an output of the Sigma-Delta modulator and configured to provide a first digital output signal that is proportional to an analog signal at the input pin in a first input range between a first analog signal value and a second analog signal value, wherein the first input range corresponds to a pre-determined range of the analog signal that is smaller than a full-scale input range of the analog signal; and an open pin detection circuit coupled to the output of the Sigma-Delta modulator, the open pin detection circuit configured to convert the output of the Sigma-Delta modulator to a second output signal, compare the second output signal to a first threshold, wherein the first threshold corresponds to a third analog signal value of the analog signal at the input pin that is outside of the first input range, and provide an indication of an open circuit condition at the input pin when the second output signal crosses the first threshold.

Example 11

The integrated circuit of example 10, wherein the input pin of the integrated circuit comprises a first input pin and a second input pin, wherein the pin biasing circuit is configured to apply a first current to the first input pin and to apply a second current to the second input pin, and wherein the Sigma-Delta modulator comprises a differential input coupled to the first input pin and the second input pin.

Example 12

The integrated circuit of example 10, wherein the open pin detection circuit is further configured to: compare the second output signal to a second threshold, wherein the second threshold corresponds to a fourth analog signal value of the analog signal at the input pin that is outside of the first input range; and provide the indication of the open circuit condition at the input pin when the second output signal crosses the second threshold, wherein the third analog signal value is greater than the second analog signal value and the fourth analog signal value is less than the first analog signal value, wherein the first analog signal value is less than the second analog signal value.

Example 13

The integrated circuit of example 10, wherein the pin biasing circuit comprises a pull-up resistor or a pull-down resistor configured to be coupled between a power supply and the input pin of the integrated circuit.

Example 14

The integrated circuit of example 10, wherein the pin biasing circuit comprises a current source configured to be coupled between a power supply and the input pin of the integrated circuit.

Example 15

The integrated circuit of example 10, wherein the Sigma-Delta modulator is configured to convert the analog signal at the input pin of the integrated circuit into a one-bit data stream.

Example 16

The integrated circuit of example 15, wherein the open pin detection circuit comprises a counter configured to count a number of consecutive ones or consecutive zeros in the one-bit data stream.

Example 17

The integrated circuit of example 15, wherein the open pin detection circuit comprises an analog low-pass filter configured to convert the one-bit data stream into an analog output signal.

Example 18

In an embodiment, an analog-to-digital converter circuit comprises a first input terminal and a second input terminal; a Sigma-Delta modulator coupled to the first input terminal and the second input terminal and configured to convert a voltage between the first input terminal and the second input terminal into a one-bit data stream; a pull-up circuit configured to be coupled between a voltage supply node and the first and the second input terminals and to pull a first voltage at the first input terminal to a first voltage value higher than a pre-determined voltage threshold when the first input terminal is left open, or to pull a second voltage at the second input terminal to the first voltage value when the second input terminal is left open, wherein the pre-determined voltage threshold is smaller than a full-scale input voltage of the Sigma-Delta modulator by a pre-determined percentage; a first low-pass filter coupled to an output of the Sigma-Delta modulator and configured to convert the one-bit data stream into a first multi-bit data stream at an output of the analog-to-digital converter circuit; and an open pin detection circuit coupled to the output of the Sigma-Delta modulator and configured to detect that the voltage between the first input terminal and the second input terminal is above the pre-determined voltage threshold using the one-bit data stream.

Example 19

The analog-to-digital converter circuit of example 18, wherein the open pin detection circuit comprises: a counter configured to count a number of consecutive zeros or consecutive ones in the one-bit data stream; and a comparator configured to compare the number of consecutive zeros or consecutive ones with a pre-determined threshold.

Example 20

The analog-to-digital converter circuit of example 18, wherein the open pin detection circuit comprises: a second low-pass filter coupled to the output of the Sigma-Delta modulator and configured to convert the one-bit data stream into a second multi-bit data stream, wherein a gain of the second low-pass filter is less than a gain of the first low-pass filter and a bit width of the second multi-bit data stream is smaller than a bit width of the first multi-bit data stream; and a comparator configured to compare values of the second multi-bit data stream with a pre-determined threshold.

Example 21

The analog-to-digital converter circuit of example 18, wherein the first input terminal, the second input terminal, the Sigma-Delta modulator, the pull-up circuit, the first low-pass filter, and the open pin detection circuit are integrated in a same integrated circuit device.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A method comprising:
    applying a current to an input pin of an integrated circuit;
    converting an analog signal at the input pin to a digital stream using a Sigma-Delta modulator;
    converting the digital stream to a first digital output signal using a decimation filter, wherein the first digital output signal is proportional to the analog signal at the input pin in a first input range between a first analog signal value and a second analog signal value, wherein the first input range corresponds to a pre-determined range of the analog signal that is smaller than a full-scale input range of the analog signal;
    converting the digital stream to a second output signal;
    comparing the second output signal to a first threshold, wherein the first threshold corresponds to a third analog signal value of the analog signal at the input pin that is outside of the first input range; and
    providing an indication of an open circuit condition at the input pin when the second output signal crosses the first threshold.

2. The method of claim 1, wherein:
    the input pin comprises a first input pin and a second input pin;
    applying the current to the input pin comprises applying a first current to the first input pin and applying a second current to the second input pin; and
    the Sigma-Delta modulator comprises a differential input coupled to the first input pin and the second input pin.

3. The method of claim 2, further comprising:
    comparing the second output signal to a second threshold, wherein the second threshold corresponds to a fourth analog signal value of the analog signal at the input pin that is outside of the first input range; and
    providing the indication of the open circuit condition at the input pin when the second output signal crosses the second threshold, wherein the third analog signal value is greater than the second analog signal value and the fourth analog signal value is less than the first analog signal value, and the second analog signal value is greater than the first analog signal value.

4. The method of claim 1, wherein applying the current to the input pin of the integrated circuit comprises using a pull-up resistor or a pull-down resistor.

5. The method of claim 1, wherein applying the current to the input pin of the integrated circuit comprises using a current source.

6. The method of claim 1, wherein the digital stream comprises a one-bit data stream.

7. The method of claim 6, wherein converting the digital stream to the second output signal comprises converting the digital stream to the second output signal using a counter.

8. The method of claim 6, wherein converting the digital stream to the second output signal comprises converting the digital stream to the second output signal using an analog low-pass filter.

9. The method of claim 1, wherein the first analog signal value corresponds to a minimum output code of the first digital output signal and the second analog signal value corresponds to a maximum output code of the first digital output signal.

10. An integrated circuit comprising:
a pin biasing circuit configured to provide a current to an input pin of the integrated circuit;
a Sigma-Delta modulator having an input coupled to the input pin;
a decimation filter coupled to an output of the Sigma-Delta modulator and configured to provide a first digital output signal that is proportional to an analog signal at the input pin in a first input range between a first analog signal value and a second analog signal value, wherein the first input range corresponds to a pre-determined range of the analog signal that is smaller than a full-scale input range of the analog signal; and
an open pin detection circuit coupled to the output of the Sigma-Delta modulator, the open pin detection circuit configured to
convert the output of the Sigma-Delta modulator to a second output signal,
compare the second output signal to a first threshold, wherein the first threshold corresponds to a third analog signal value of the analog signal at the input pin that is outside of the first input range, and
provide an indication of an open circuit condition at the input pin when the second output signal crosses the first threshold.

11. The integrated circuit of claim 10, wherein the input pin of the integrated circuit comprises a first input pin and a second input pin, wherein the pin biasing circuit is configured to apply a first current to the first input pin and to apply a second current to the second input pin, and wherein the Sigma-Delta modulator comprises a differential input coupled to the first input pin and the second input pin.

12. The integrated circuit of claim 10, wherein the open pin detection circuit is further configured to:
compare the second output signal to a second threshold, wherein the second threshold corresponds to a fourth analog signal value of the analog signal at the input pin that is outside of the first input range; and
provide the indication of the open circuit condition at the input pin when the second output signal crosses the second threshold, wherein the third analog signal value is greater than the second analog signal value and the fourth analog signal value is less than the first analog signal value, wherein the first analog signal value is less than the second analog signal value.

13. The integrated circuit of claim 10, wherein the pin biasing circuit comprises a pull-up resistor or a pull-down resistor configured to be coupled between a power supply and the input pin of the integrated circuit.

14. The integrated circuit of claim 10, wherein the pin biasing circuit comprises a current source configured to be coupled between a power supply and the input pin of the integrated circuit.

15. The integrated circuit of claim 10, wherein the Sigma-Delta modulator is configured to convert the analog signal at the input pin of the integrated circuit into a one-bit data stream.

16. The integrated circuit of claim 15, wherein the open pin detection circuit comprises a counter configured to count a number of consecutive ones or consecutive zeros in the one-bit data stream.

17. The integrated circuit of claim 15, wherein the open pin detection circuit comprises an analog low-pass filter configured to convert the one-bit data stream into an analog output signal.

18. An analog-to-digital converter circuit comprising:
a first input terminal and a second input terminal;
a Sigma-Delta modulator coupled to the first input terminal and the second input terminal and configured to convert a voltage between the first input terminal and the second input terminal into a one-bit data stream;
a pull-up circuit configured to be coupled between a voltage supply node and the first and the second input terminals and to pull a first voltage at the first input terminal to a first voltage value higher than a pre-determined voltage threshold when the first input terminal is left open, or to pull a second voltage at the second input terminal to the first voltage value when the second input terminal is left open, wherein the pre-determined voltage threshold is smaller than a full-scale input voltage of the Sigma-Delta modulator by a pre-determined percentage;
a first low-pass filter coupled to an output of the Sigma-Delta modulator and configured to convert the one-bit data stream into a first multi-bit data stream at an output of the analog-to-digital converter circuit; and
an open pin detection circuit coupled to the output of the Sigma-Delta modulator and configured to detect that the voltage between the first input terminal and the second input terminal is above the pre-determined voltage threshold using the one-bit data stream.

19. The analog-to-digital converter circuit of claim 18, wherein the open pin detection circuit comprises:
a counter configured to count a number of consecutive zeros or consecutive ones in the one-bit data stream; and
a comparator configured to compare the number of consecutive zeros or consecutive ones with a pre-determined threshold.

20. The analog-to-digital converter circuit of claim 18, wherein the open pin detection circuit comprises:
a second low-pass filter coupled to the output of the Sigma-Delta modulator and configured to convert the one-bit data stream into a second multi-bit data stream, wherein a gain of the second low-pass filter is less than a gain of the first low-pass filter and a bit width of the second multi-bit data stream is smaller than a bit width of the first multi-bit data stream; and
a comparator configured to compare values of the second multi-bit data stream with a pre-determined threshold.

21. The analog-to-digital converter circuit of claim 18, wherein the first input terminal, the second input terminal, the Sigma-Delta modulator, the pull-up circuit, the first low-pass filter, and the open pin detection circuit are integrated in a same integrated circuit device.

* * * * *